United States Patent

Honma

[11] Patent Number: 5,305,052
[45] Date of Patent: Apr. 19, 1994

[54] IMAGE FORMING APPARATUS

[75] Inventor: Yoshiyasu Honma, Katano, Japan

[73] Assignee: Brother Kogyo Kabushiki Kaisha, Nagoya, Japan

[21] Appl. No.: 956,177

[22] Filed: Oct. 5, 1992

[30] Foreign Application Priority Data

| Oct. 16, 1991 | [JP] | Japan | 3-267549 |
| Oct. 30, 1991 | [JP] | Japan | 3-285007 |
| Nov. 7, 1991 | [JP] | Japan | 3-291677 |

[51] Int. Cl.$^5$ .................. G03B 27/32; G03B 27/52
[52] U.S. Cl. ..................................... 355/27; 430/138
[58] Field of Search ................. 355/27; 430/138; 118/620, 640, 257

[56] References Cited

U.S. PATENT DOCUMENTS

| 4,016,099 | 4/1977 | Wellman et al. | 430/137 |
| 4,399,209 | 8/1983 | Sanders et al. | |
| 4,717,638 | 1/1988 | Mikami et al. | 430/138 X |
| 4,748,475 | 5/1988 | Ishiyama et al. | 355/27 |
| 4,783,683 | 11/1988 | Nagumo et al. | |
| 4,912,011 | 3/1990 | Yamamoto et al. | |
| 4,943,509 | 7/1990 | Sakai et al. | |
| 5,060,011 | 10/1991 | Yamamoto et al. | |
| 5,100,756 | 3/1992 | Kobayashi | 430/138 |
| 5,114,824 | 5/1992 | Tan et al. | 430/138 X |
| 5,164,762 | 11/1992 | Hattori et al. | 355/27 |
| 5,175,582 | 12/1992 | Kondo | 355/27 |
| 5,196,882 | 3/1993 | Kondo | 355/27 |
| 5,202,722 | 4/1993 | Ohta | 355/27 |
| 5,204,205 | 4/1993 | Anno et al. | 430/138 X |
| 5,204,208 | 4/1993 | Paine et al. | 430/138 X |
| 5,215,851 | 6/1993 | Tomita et al. | 430/138 X |
| 5,215,855 | 6/1993 | Keoshkerian et al. | 430/138 |
| 5,223,370 | 6/1993 | Sacripante et al. | 430/138 |
| 5,223,371 | 6/1993 | Ohta | 430/138 |

Primary Examiner—Matthew S. Smith
Attorney, Agent, or Firm—Oliff & Berridge

[57] ABSTRACT

An image supporting medium coated with microcapsule toner particles is exposed according to an image pattern, and then a latent image is formed thereon. The image supporting medium on which the latent image is formed and the image recording paper are superposed and pressurized, and the microcapsule toner particles are ruptured and the contents included therein are released. During this process, hardened microcapsule toner particles and wall material of the ruptured microcapsule toner particles from which the contents flowed remain on the image supporting medium by a keying effect, and only the contents, i.e. the toner, are transferred onto the image recording paper. Moreover, the critical surface tension of the wall material of the microcapsule toner particles is smaller than the surface tension of the contents of the microcapsule toner particles. Further, the surface tension of the contents of the microcapsule toner particles is smaller than the critical surface tension of the image recording paper confronting with the image supporting medium. Thus, only the contents of the microcapsules, i.e. the toner, are transferred to the image recording paper. Therefore, a clear and accurate image is formed thereon.

23 Claims, 4 Drawing Sheets

IMAGE FORMING APPARATUS

BACKGROUND OF THE INVENTION

1. Field of the Invention

The present invention relates to an image forming apparatus, and more particularly to an image forming apparatus which uses photosensitive microcapsule toner particles.

2. Description of Related Art

It is well known to provide an image forming apparatus which uses a photosensitive medium coated with microcapsules comprising a dyeprecursor and a photo hardening material, etc. For example, such an image forming apparatus is disclosed in U.S. Pat. No. 4,399,209 in which the photosensitive medium is exposed based on image information, the microcapsules coated thereon are hardened, and then a latent image is formed on the photosensitive medium. Afterwards, an image forming paper coated with developer, which reacts with the dyeprecursor and makes color, is overlapped with the photosensitive medium and pressure is applied. The latent image is developed by applying such pressure, and an image is fixed on the image forming paper.

Further, U.S. Pat. No. 4,943,509 discloses another image forming apparatus using the above photosensitive medium. In the apparatus, a photosensitive medium on which a latent image is formed and an image forming paper which is an ordinary paper are overlapped putting a developer layer between them, and are pressurized, so that an image is formed on the ordinary paper. U.S. Pat. No. 5,060,011 shows a similar apparatus.

Furthermore, another image forming apparatus which uses a photosensitive medium which supports the microcapsules utilizes a coloring agent instead of the dyeprecursor discussed above, as disclosed in U.S. Pat. No. 4,783,683 (Japanese Laid-Open Patent Publication No. 62-232652). A recording material including a coloring agent is disclosed in detail in U.S. Pat. No. 4,912,011.

However, each photosensitive medium used in the above image forming apparatuses includes a plastic film layer such as PET (polyethylene terephthalate) film as a supporting layer with photosensitive microcapsules provided thereon. This kind of photosensitive medium is used as a member for aiding image formation and is disposed after use. Therefore, in conventional image forming apparatuses, the plastic film used as the supporting layer, which is not essential to form the image, is consumed in each use. Therefore, the cost for disposable photosensitive medium supplies is high. Thus, the whole cost for forming the image is increased.

Ideally, a reusable photosensitive supporting medium from which the photosensitive microcapsules could easily separate would be desirable in order to reduce costs. However, a clear and accurate image must still be formed. If the microcapsules easily separate from the supporting medium, a blurred image will occur since all of the microcapsule material, including the ruptured walls and hardened microcapsules along with the toner, will transfer to the image recording medium. Thus, it has not been possible to provide a reusable photosensitive supporting medium which creates a clear and accurate image.

SUMMARY OF THE INVENTION

It is therefore an object of the present invention is to provide an image forming apparatus which will transfer only the contents of the microcapsules to an image recording medium and which will form a clear and accurate printed image thereon.

In order to attain the above and other objects, an image forming apparatus according to the present invention comprises an image supporting medium having microcapsule toner particles coated thereon, each said microcapsule toner particle comprising a microcapsule wall and flowable contents contained therein; an image recording medium; exposure means for forming a latent image of an original on the image supporting medium by hardening selected microcapsule toner particles corresponding to the latent image; and pressure developing means for applying pressure to the image supporting medium to rupture non-hardened microcapsule toner particles and for transferring the flowable contents to the image recording medium; wherein the hardened microcapsules and the ruptured microcapsule walls remain on the image supporting medium while the flowable contents are transferred to the image recording medium.

In the image forming apparatus of the present invention thus constructed, when pressure is added to the supporting member on which the microcapsule toner particles are supported based on an original image, the contents, i.e. toner, flow out from the microcapsule toner particles which correspond to the area where the image will be formed. Then, the supporting member and the image recording medium are superposed with each other in the transferring means, so that only the contents are transferred to the image recording paper. Thus, the visible image is formed.

During this process, the wall material of the microcapsules from which the contents flowed adheres onto the supporting member by a keying effect, and only the contents are transferred to the image recording paper. Thus, an excellent image is formed thereon. Further, at this time, the contents, i.e. the toner, do not adhere to the microcapsule wall because the critical surface tension of the wall material of the microcapsules is smaller than the surface tension of the toner. Therefore, the contents separate from the microcapsule wall easily, and are easily transferred to the image recording medium. Moreover, the contents adhere easily to the image recording medium since the surface tension of the contents of the microcapsule toner particles is smaller than the critical surface tension of the image recording medium which confronts the supporting member in the transferring means. Therefore, the toner is easily transferred to the image recording medium. Thus, an excellent image is formed thereon.

As explained above, in the image forming apparatus of the present invention, the wall material of the capsule toner particles from which the contents flowed are adhered on the supporting member by a keying effect, and only the toner is transferred to the image recording paper. Moreover, only the contents are transferred to the image recording medium because the critical surface tension of the wall material of the microcapsule toner particles is smaller than the surface tension of the contents, and the surface tension of the contents is smaller than the critical surface tension of the image recording medium which confronts the supporting member in the transferring means. Therefore, an excellent image can be obtained.

BRIEF DESCRIPTION OF THE DRAWINGS

Preferred embodiments of the present invention will be described in detail with reference to the following figures wherein.

DETAILED DESCRIPTION OF PREFERRED EMBODIMENTS

Referring now to the accompanying drawings, preferred embodiments of the present invention will be described in detail.

Figure 1:
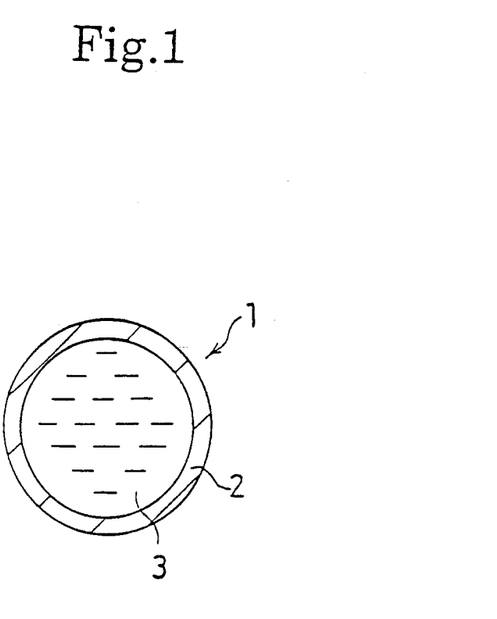
FIG. 1 is a cross-sectional view of the microcapsule toner particle used for an image forming apparatus according to embodiments of the present invention.

FIG. 1 is a cross-sectional view of the microcapsule toner particle used for an image forming apparatus according to embodiments of the present invention. As shown in FIG. 1, a photosensitive microcapsule toner particle 1 includes an outer wall 2 and contents 3. The contents 3 are a photocurable composition in which acrylic monomer, photopolymerization initiator, sensitizing dye, and coloring agents such as pigment and dye are mixed. The surface tension of the contents 3 is about 34 dyne/cm. The wall 2 is constructed from material whose critical surface tension is smaller than the surface tension of the contents 3, such as polyethylene. The surface tension of the wall material 2 is, for example, about 31 dyne/cm.

Figure 2:
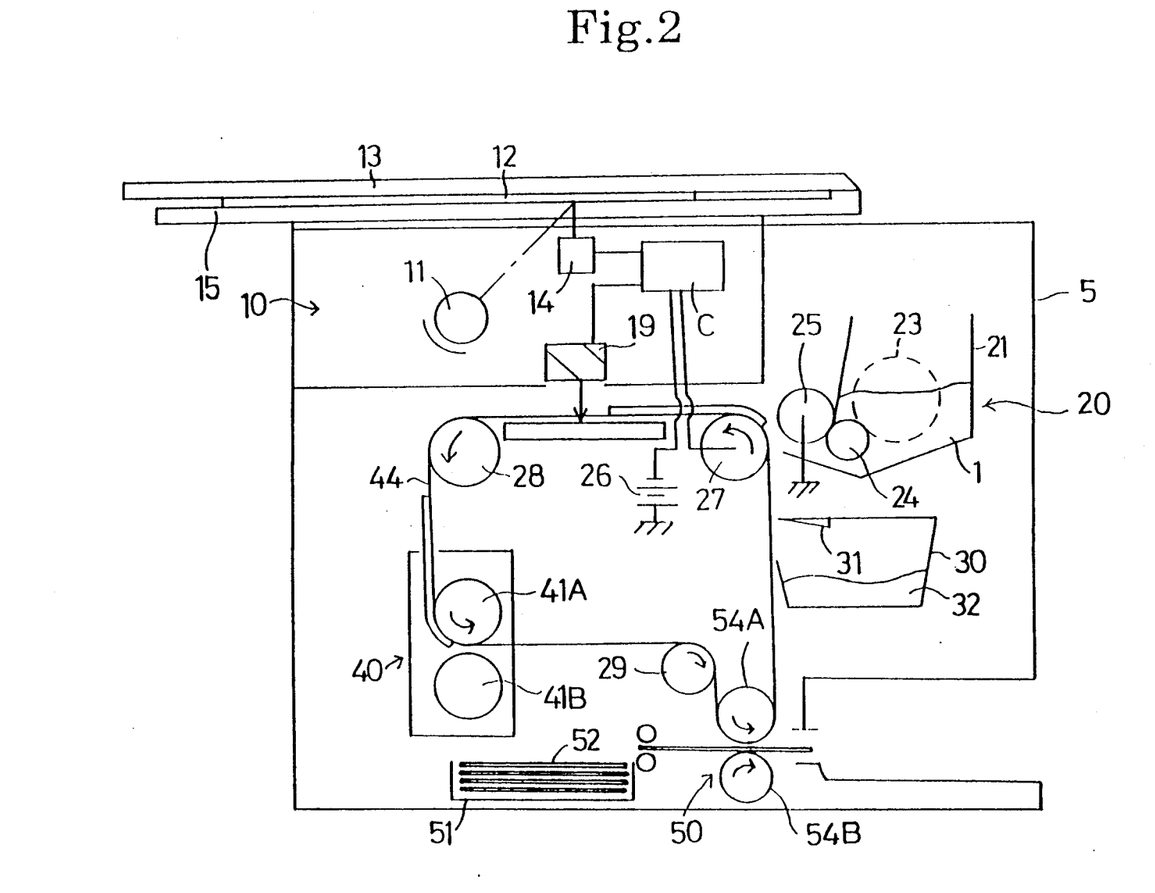
FIG. 2 is an schematic side elevational view showing an image forming apparatus according to the first embodiment of the present invention.

Next, an image forming apparatus of a first embodiment will be explained with reference to FIG. 2. An exposure unit 10, a microcapsule toner particle coating unit 20, a pressure developing unit 40, and an image transferring unit 50 are installed in an image forming apparatus 5. Each unit is arranged so that an image supporting medium 44 of an endless belt type can be moved therethrough. The image supporting medium 44 has microcapsule toner particles supported thereon as described below.

The exposure unit 10 includes an exposure lamp 11 which exposes an original, a support stand glass 15 on which the original is placed, an original cover 13 which covers the original, a scanner 14 for inputting a reflection light from the original and reading an image thereon, a controller C for controlling an image signal read by the scanner 14, and an exposure head 19 including a lamp and a liquid crystal shutter for exposing microcapsules supported on the image supporting medium 44 based on the signal from the controller C.

The microcapsule toner particle coating unit 20 includes microcapsule toner particles 1, a toner particle casing 21 which stores the toner particles 1 therein, an agitator 23 for stirring the toner particles 1 stored in the toner particle casing 21, a carrying roller 25 for carrying the toner particles 1, and a supplying roller 24 for supplying the toner particles 1 to the carrying roller 25. This microcapsule toner particle coating unit 20 is arranged adjacent the image supporting medium 44.

In the pressure developing unit 40, a pair of pressure rollers 41A, 41B are arranged so that the image supporting medium 44 on which the microcapsule toner particles 1 are coated can pass therebetween. The pressure roller 41B which touches the surface of the coated image supporting medium 44 is formed of material having small critical surface tension, for instance, Teflon.

The image supporting medium 44, which is preferably made of a film sheet of synthetic resin, is extended through a driving roller 28 driven by a well-known motor, a confronting roller 27, a following roller 29, a pressure roller 41A, and a transferring roller 54A.

The confronting roller 27 is connected to a power supply 26 through the controller C, so that an electric field is selectively formed in the area between the confronting roller 27 and the carrying roller 25.

In the image transferring unit 50, a pair of transferring rollers 54A, 54B are arranged to pass the image supporting medium 44, on which the image is formed, and an image recording paper 52 therebetween.

Beneath the toner particle coating unit 20, a cleaning unit 30 having a cleaning blade 31 is arranged adjacent to the image supporting medium 44. The cleaning unit 30 collects hardened microcapsule toner particles 32 scraped from the image supporting medium 44.

The surface of the image supporting medium 44 is rougher than that of the image recording paper 52. In general, the surface roughness of the image recording paper 52 is about Rz15 $\mu$m. Therefore, it is preferable that the surface roughness of the image supporting medium 44 is more than about Rz20 $\mu$m. (Rz is a unit expressing the average surface roughness of an object.) If the image recording paper 52 is more smooth, the image supporting medium 44 also can be made more smooth. In this case, the surface of the output image also becomes more smooth.

A description will now be provided of the operation of the above described device. The driving roller 28 rotates when the start switch (not shown) is turned on and drives the image supporting medium 44. In the microcapsule toner particle coating unit 20, the toner particles 1 are electrostatically charged by the rotation of the agitator 23 and the supplying roller 24 and are supported on the carrying roller 25. The toner particles 1 supported by the carrying roller 25 are electrostatically attracted in the direction of the confronting roller 27 by the electric field formed between the confronting roller 27 and the carrying roller 25. As a result, the toner particles 1 are uniformly coated over the surface of the image supporting medium 44.

Next, the photosensitive microcapsule toner particles are transported beneath the exposure unit 10. The exposure lamp 11, preferably a halogen lamp, is lit and the support stand glass 15 on which an original 12 is placed moves. An exposure operation is performed according to the original 12. The light reflected by the original 12 is read by the scanner 14. The controller C controls the exposure head 19 based on the image signal read by the scanner 14. The surface of the image supporting medium 44, on which the microcapsule toner particles 1 are coated, is then exposed to the light based on an original image pattern. Thereby, a latent image is formed onto the image supporting medium 44. Then the image supporting medium 44 is further transported to the pressure developing unit 40.

In the pressure developing unit 40, the image supporting medium 44, which supports the toner particles 1 thereon and on which the latent image is formed, passes between the pressure rollers 41A and 41B, and pressure is applied. The microcapsule toner particles which are not hardened by the exposure operation in the exposure unit 10 are ruptured and the contents 3, i.e. toner, flow out from the ruptured microcapsules.

The pressure roller 41B is formed with a material having a small critical surface tension such as Teflon. Therefore, when the image supporting medium 44 passes over the pressure roller 41B, the hardened microcapsule toner particles 32, the contents 3, and the wall material 2 will remain on the surface of the image supporting medium 44. Further, the hardened microcapsule toner particles 32 and the wall material 2 of the ruptured microcapsules are adhered to the image supporting medium 44 by a keying effect. The keying effect is caused when some objects, such as the hardened microcapsule toner particles and the microcapsule walls, enter a space of irregularity in the surface of the image recording paper and act as a keystone, causing mechanical adhesion. Afterwards, the image supporting medium 44 is transported to the image transferring unit 50.

During the pressure operation, the image recording paper 52, which is an ordinary paper, is removed from a sheet cassette 51 and is sent to the image transferring unit 50.

In the image transferring unit 50, the image supporting medium 44 on which the image is formed and the image recording paper 52 are fed between a pair of transferring rollers 54A, 54B, and are pressurized. Therefore, the toner 3 is transferred onto the image recording paper 52, and the image is formed thereon. Afterwards, the image formed on the image recording paper 52 is fixed by a thermal fixing unit (not shown), and the image recording paper 52 is discharged onto a discharge tray. During this process, the hardened microcapsule toner particles 32 and the wall material 2 of the ruptured microcapsules remain on the image supporting medium 44 by the keying effect, because the surface of the image supporting medium 44 is rougher than that of the image recording paper 52.

Moreover, the microcapsules rupture and adhere to the image supporting medium 44 because the wall material has a critical surface tension which is smaller than the surface tension of the contents 3. Therefore, the contents 3 are easily separated from the wall material 2 and are easily transferred to the image recording paper 52. Moreover, if the image recording paper 52 itself or the surface of the image recording paper 52 is formed with a material having a critical surface tension which is much larger than the surface tension of the contents 3, for example, nylon (whose critical surface tension is about 42–46 dyne/cm), the contents 3 adhere easily to the image recording paper 52 and transfer more easily to it.

Afterwards, the hardened microcapsule toner particles 32 and the wall material 2 of the ruptured microcapsules remaining on the image supporting medium 44 are removed therefrom by being scraped by the blade 31 in the cleaning unit 30. Then, the microcapsule toner particles 1 are coated again onto the image supporting medium 44 which passes from the cleaning unit 30.

As discussed above, the hardened microcapsule toner particle 32 and the wall material 2 of the ruptured microcapsules from which the contents 3 flowed remain on the image supporting medium 44 through the keying effect, with only the contents 3 being transferred onto the image recording paper 52, because the surface of image supporting medium 44 is rougher than that of image recording paper 52. Moreover, only the contents 3 are transferred to the image recording paper 52 because the critical surface tension of the wall material 2 of the microcapsule toner particles is smaller than the surface tension of the contents 3, and the surface tension of the contents 3 is smaller than the critical surface tension of the image recording paper 52 which confronts the image supporting medium 44 in the transferring unit 50. Therefore, an excellent image is formed on the image recording paper 52.

Further, as explained above, the pressure developing unit 40 and the transferring unit 50 are separately provided, so that the developing operation can be performed firmly with high pressure in an instant, and then the transferring operation can be performed carefully. Therefore, the image recording paper 52 is not damaged and an excellent image can be formed.

In should be noted that the invention is not limited to the above preferred embodiment, but may be embodied in various modes without departing from the scope of the invention. For instance, it is possible to easily clean the remaining microcapsule toner particles 32 and the wall material 2 in the cleaning unit 30 by applying light to the image supporting medium 44 after pressure developing.

Moreover, the photosensitive material contained in each microcapsule may be of the type which is hardened upon exposure to radiation, or alternatively of the type which is softened upon such exposure.

Furthermore, in the present embodiment, the microcapsule toner particles are coated onto the whole surface of the image supporting medium, and then the image supporting medium is exposed to the light based on the original image. However, the microcapsule toner particles can be previously selected and coated onto the image supporting medium based on the original image.

A second embodiment will be described with reference to FIG. 3. Because the construction of the image forming apparatus of the second embodiment is similar to that of the image forming apparatus of the first embodiment, only the differences will be described in detail.

The main difference between the first embodiment and the second embodiment is that the mechanical structure of the pressure developing unit 40 of the first embodiment has been modified.

Figure 3:
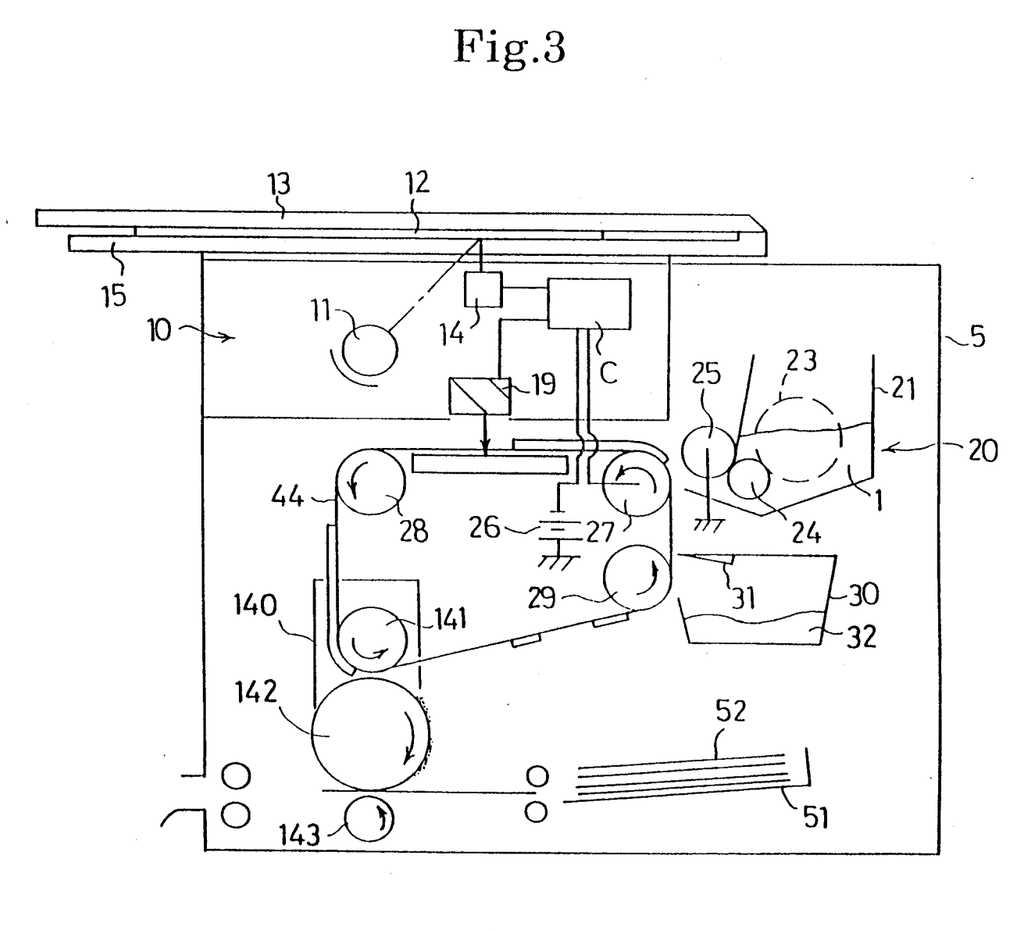
FIG. 3 is an schematic side elevational view showing an image forming apparatus according to the second embodiment of the present invention.

As shown in FIG. 3, in a pressure developing unit 140, a pressure roller 141 and a pressure developing and transferring roller 142 are arranged so that an image supporting medium 44 coated with microcapsule toner particles is passed therebetween. Also, beneath the pressure developing and transferring roller 142, a transferring roller 143 is arranged in order to pass an image recording paper therebetween. The surface of the pressure developing and transferring roller 142 is formed with a material having a critical surface tension which is larger than the surface tension of contents 3, such as nylon (whose critical surface tension is about 42–46 dyne/cm).

The image supporting medium 44 on which the toner particles are coated and a latent image is formed passes between the pressure roller 141 and the pressure developing and transferring roller 142 in the pressure developing unit 140. The contents 3 of the microcapsule toner particles flow out from the toner particles which did not harden in the exposure unit 10 when the toner particles are pressurized in the above pressure developing unit 140. At this time, the hardened microcapsule toner particles 32 and the wall material 2 of the ruptured microcapsules remain on the image supporting medium 44 by the keying effect because the surface of the image supporting medium 44 is rougher than that of the pressure developing and transferring roller 142.

Moreover, only the contents 3 are transferred onto the pressure developing and transferring roller 142 because the roller 142 is formed with a material having a critical surface tension which is larger than the surface tension of the contents 3.

On the other hand, the image recording paper 52, which is an ordinary paper, is supplied from the sheet cassette 51 and is fed and pressurized between the pressure developing and transferring roller 142, on which the contents 3 are supported, and the transferring roller 143. Then, the contents 3 are transferred to the image recording paper 52 by capillarity, and the image is formed on the image recording paper 52. Afterwards, the image is fixed by a thermal fixing unit (not shown), and the image recording paper 52 with the fixed image is discharged onto a discharge tray.

Finally, the image supporting medium 44 with the remaining hardened microcapsule toner particles 32 and the wall material 2 of the ruptured microcapsules from which the contents 3 flowed is transferred to a cleaning unit 30. The hardened microcapsule toner particles 32 and the wall material 2 are scraped by a blade 31 in the cleaning unit 30 and removed from the image supporting medium 44. Then, microcapsule toner particles 1 are again coated onto the image supporting medium 44 which has been cleaned in the cleaning unit 30.

Accordingly, in the second embodiment, it is not necessary to provide a separate image transferring part, so that the image forming apparatus of the second embodiment has a simple construction.

Further, according to this second embodiment, it is possible to prevent the toner from changing in quality which can happen in a long feeding path because the feeding path of the contents flowing from the ruptured microcapsules is shortened.

A third embodiment will be described with reference to FIG. 4. Because the construction of the image forming apparatus of the third embodiment is similar to that of the image forming apparatus of the first embodiment, only the differences will be described in detail.

The main difference between the first embodiment and the third embodiment is that the mechanical structure of the pressure developing unit 40 of the first embodiment has been modified.

Figure 4:
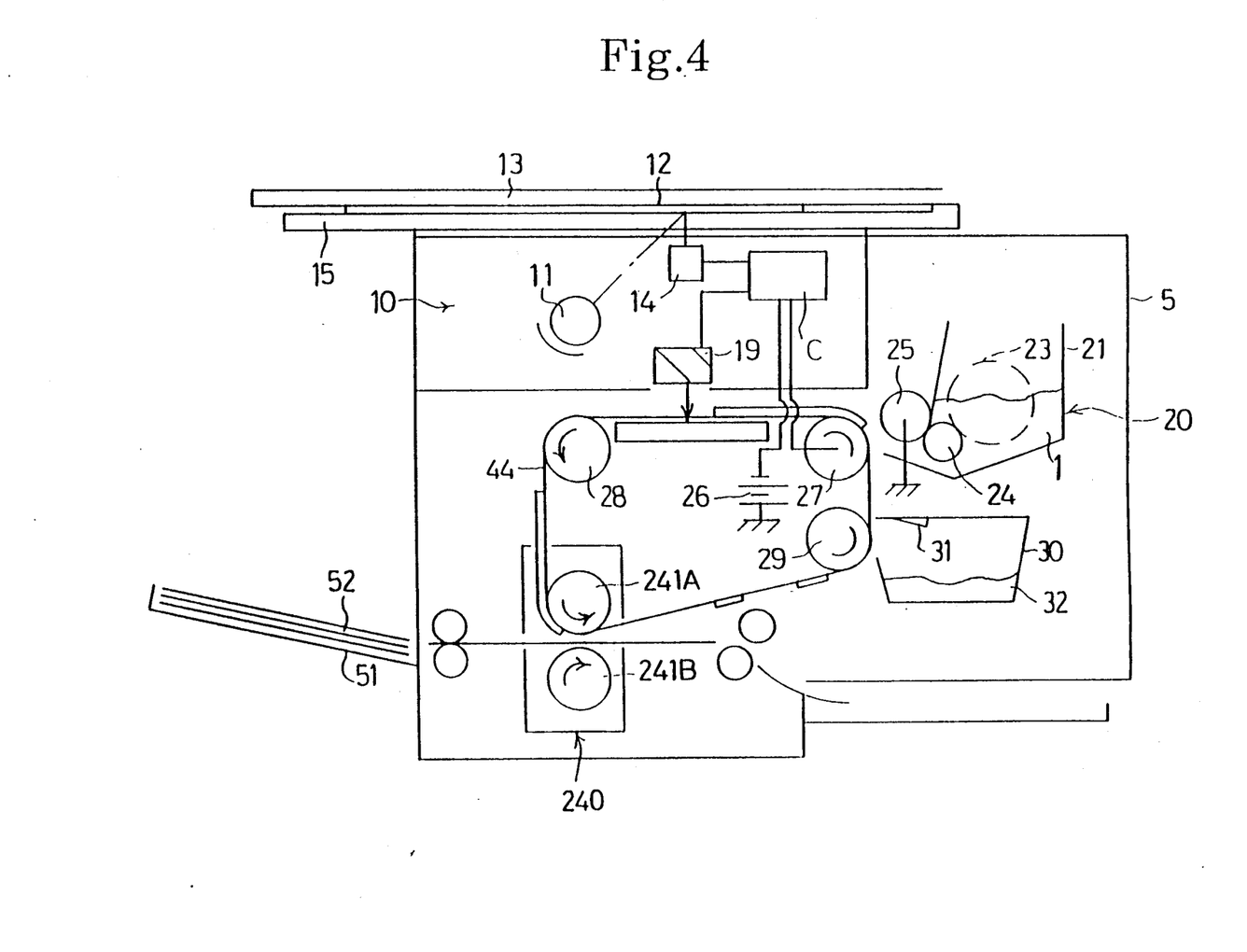
FIG. 4 is an schematic side elevational view showing an image forming apparatus according to the third embodiment of the present invention.

As shown in FIG. 4, in a pressure developing unit 240, a pair of pressure rollers 241A, 241B are arranged to pass an image supporting medium 44, with microcapsule toner particles coated thereon and the latent image formed thereon, and an image recording paper 52 therethrough.

The image supporting medium 44 on which a latent image is formed is transferred to the pressure developing unit 240. The image recording paper 52, which is an ordinary paper, is supplied from a sheet cassette 51 and is fed into the pressure developing unit 240. In the pressure developing unit 240, the image supporting medium 44 on which the toner particles are coated and the latent image is formed, and the image recording paper 52 are superposed and pass between the pressure rollers 241A and 241B. The contents 3 of the microcapsule toner particles flow from the microcapsules which do not harden when the microcapsule toner particles are pressurized in the above pressure developing unit 140. Therefore, only the contents, i.e. toner, are transferred to the image recording paper 52, and the image is formed on the image recording paper 52. Afterwards, the image recording paper 52 upon which the image is fixed by a thermal fixing unit (not shown) is discharged onto a discharge tray. At this time, the hardened microcapsule toner particles 32 and the wall material 2 of the ruptured microcapsules from which the contents 3 flowed remain on the image supporting medium 44 by a keying effect, because the surface of the image supporting medium 44 is rougher than that of the image recording paper 52. The hardened microcapsule toner particles 32 and the wall material 2 of the ruptured microcapsules remaining on the image supporting medium 44 are then transferred to the cleaning unit 30 and are scraped by the blade 31 in the cleaning unit 30, thereby removing them from the image supporting medium 44. Then, the microcapsule toner particles 1 are again coated onto the image supporting medium 44 which has passed from the cleaning unit 30.

Accordingly, in the third embodiment, an image can be transferred to the image recording paper in the pressure developing part, so that it is not necessary to provide an image transferring part in the image forming apparatus of the third embodiment. Therefore, the construction of the image forming apparatus of the third embodiment becomes more simple.

Although the invention has been described in its preferred forms with a certain degree of particularity, obviously many changes and variations are possible therein. It is therefore to be understood that the invention may be practiced otherwise than as specifically described herein without departing from the scope and spirit of the invention.

What is claimed is:

1. An image forming apparatus comprising:
   image supporting medium having a first surface and microcapsule toner particles coated thereon, each said microcapsule toner particle comprising a microcapsule wall and flowable contents contained therein;
   image recording medium having a second surface, said first surface being rougher than said second surface;
   exposure mechanism forming a latent image of an original on said image supporting medium by hardening selected microcapsule toner particles corresponding to the latent image; and
   pressure developing mechanism causing said first surface to confront said second surface and applying pressure to said image supporting medium to rupture non-hardened microcapsule toner particles, transfer the flowable contents to said image recording medium, and mechanically adhere the hardened microcapsules and ruptured microcapsule walls onto said image supporting medium.

2. The image forming apparatus according to claim 1, wherein each said microcapsule wall has a critical surface tension and said contents have a surface tension, said microcapsule wall critical surface tension being smaller than said contents surface tension.

3. The image forming apparatus according to claim 1, wherein said image recording medium has a critical surface tension and said contents have a surface tension, said contents surface tension being smaller than the image recording medium critical surface tension.

4. The image forming apparatus, according to claim 1, further comprising a coating device coating microcapsule toner particles on said image supporting medium.

5. The image forming apparatus according to claim 1, further comprising:
a cleaning device cleaning the hardened microcapsules and ruptured microcapsule walls from said image supporting medium.

6. The image forming apparatus according to claim 1, wherein said pressure developing mechanism comprises a pressure developing unit including at least one pressure roller for rupturing the microcapsule toner particles, and an image transferring unit including at least one transfer roller spaced from said pressure roller for transferring the flowable contents from the ruptured microcapsules to the image recording medium.

7. The image forming apparatus according to claim 1, wherein said pressure developing mechanism comprises a pressure roller, a pressure developing and transfer roller and a transfer roller,
said pressure developing and transfer roller being arranged between and in contact with said pressure roller and said transfer roller for carrying said flowable contents from said image supporting medium to said image recording medium.

8. The image forming apparatus of claim 1, wherein said pressure developing mechanism comprises a pair of rollers to both rupture said microcapsules and transfer said flowable contents to said image recording medium.

9. An image forming apparatus comprising:
a supporting member movably provided along a predetermined path, said supporting member having a surface supporting microcapsule toner particles, each particle having wall material with a critical surface tension and contents including a coloring agent, said contents having a surface tension which is larger than the critical surface tension of said wall material;
pressure developing and transferring means for developing an image on said supporting member for transferring the developed image said surface of said supporting member to a surface of a recording medium that is less rough than said surface of said supporting member, having a pressure member which confronts said supporting member for rupturing the microcapsule toner particles based on an original image pattern formed on said supporting member, said recording medium having a critical surface tension which is larger than the surface tension of the contents from the ruptured microcapsule toner particles; and
cleaning means for removing the wall material of the ruptured microcapsule toner particles remaining on said supporting member after the contents of the ruptured microcapsule toner particles are transferred.

10. The image forming apparatus according to claim 9, further comprising microcapsule toner particle storing means for storing the microcapsule toner particles and coating means for coating said microcapsule toner particles stored in said storing means onto said supporting member.

11. The image forming apparatus according to claim 10, wherein said supporting member extends adjacent said microcapsule toner particle storing means, said pressure developing means, and said transferring means.

12. The image forming apparatus according to claim 9, further comprising exposing means for exposing said supporting member with the microcapsule toner particles thereon to a light having an original image pattern to form a latent image thereon.

13. The image forming apparatus according to claim 9, wherein said pressure developing and transferring means includes a pressure roller, a pressure developing and transferring roller, and a transferring roller.

14. The image forming apparatus according to claim 13, wherein said pressure developing and transferring roller is formed by a material having a critical surface tension larger than the surface tension of the contents of said microcapsule toner particles.

15. The image forming apparatus according to claim 13, wherein said supporting member has a surface on which said microcapsule toner particles are coated and said pressure developing and transferring roller has a surface which confronts the supporting member surface, the supporting member surface being rougher than the pressure developing and transferring roller surface.

16. The image forming apparatus according to claim 9, wherein said pressure developing and transferring means include two confronting rollers, whereby the image pattern is simultaneously developed and transferred to said recording medium.

17. An image forming apparatus comprising:
microcapsule toner particle storing means for storing microcapsule toner particles, each particle having wall material and contents including acrylic monomer, photopolymerization initiator, sensitizing dye, and color agents, said contents having a surface tension which is larger than a critical surface tension of said wall material;
a supporting member having a surface and being movably provided along a predetermined path;
coating means for coating said microcapsule toner particles onto said surface of said supporting member;
exposing means for exposing said coated supporting member to a light having an original image pattern to form a latent image thereon;
pressure developing means having a pressure member which confronts said supporting member for rupturing the microcapsule toner particles based on the original image pattern formed on said supporting member and for developing an image on said supporting member, said pressure member having a surface formed of a material having a critical surface tension smaller than the surface tension of the contents and the critical surface tension of the wall material of said microcapsule toner particles;
transferring means for transferring the developed image from said supporting member to a surface of a recording medium, said transferring means being located downstream of said pressure developing means, wherein said recording medium has a critical surface tension which is larger than the surface tension of the contents from the ruptured microcapsule toner particles; and
cleaning means for removing the wall material of the ruptured microcapsule toner particles and photohardened microcapsule toner particles remaining on the surface of said supporting member after the contents of the ruptured microcapsule toner particles are transferred to said recording medium.

18. The image forming apparatus according to claim 17, wherein the surface of said supporting member on which said microcapsule toner particles are coated is rougher than the surface of he pressure member.

19. The image forming apparatus according to claim 17, wherein the surface of said supporting member on which said microcapsule toner particles are coated is rougher than the surface of the recording medium.

20. A method for forming an image on a recording medium comprising the steps of:
providing microcapsule toner particles on a movable supporting member, each particle having wall material and contents including coloring agents, said contents having a surface tension which is larger than a critical surface tension of said wall material;
applying pressure to said supporting member with a pressure member for rupturing the microcapsule toner particles based on an original image pattern formed on said supporting member, for developing an image on said supporting member and for mechanically adhering the wall material of the ruptured microcapsule toner particles to said supporting member;
transferring the developed image from said supporting member to a recording medium, said recording medium having a critical surface tension which is larger than a surface tension of the contents from the ruptured microcapsule toner particles, and said supporting member being rougher than said recording medium; and
removing the wall material of the ruptured microcapsule toner particles remaining on the surface of said supporting member after the contents of the ruptured microcapsule toner particles are transferred.

21. The method according to claim 20, wherein prior to applying pressure to the supporting member, the method further including the step of:
exposing the microcapsule toner particles in order to harden select particles to form a latent image based on an original image.

22. The method according to claim 20, wherein the steps of applying pressure to the supporting member and transferring the developed image to a record medium occur simultaneously.

23. The method according to claim 20, wherein the step of transferring the developed image from the supporting member to the recording member comprises carrying the contents of the ruptured microcapsules on the surface of a pressure and transferring roller, the surface of the pressure and transferring roller having a surface tension larger than he surface tension of the contents.

* * * * *